(12) United States Patent
Allen, Jr.

(10) Patent No.: US 9,024,615 B2
(45) Date of Patent: May 5, 2015

(54) NON-CONTACT VOLTAGE DETECTOR

(75) Inventor: Philip Brown Allen, Jr., Bettendorf, IA (US)

(73) Assignee: Grace Engineered Products, Inc., Davenport, IA (US)

( * ) Notice: Subject to any disclaimer, the term of this patent is extended or adjusted under 35 U.S.C. 154(b) by 639 days.

(21) Appl. No.: 13/280,966

(22) Filed: Oct. 25, 2011

(65) Prior Publication Data

US 2012/0098522 A1  Apr. 26, 2012

Related U.S. Application Data

(60) Provisional application No. 61/406,320, filed on Oct. 25, 2010.

(51) Int. Cl.
*G01R 19/00* (2006.01)
*G01R 31/02* (2006.01)
*G01R 19/155* (2006.01)

(52) U.S. Cl.
CPC .................................. *G01R 19/155* (2013.01)

(58) Field of Classification Search
CPC ............ H02J 3/18; H02J 4/00; G01R 19/155; G01R 21/06; G01R 31/3624; G01R 31/3658; G01R 31/3689; G05F 1/67; H01M 10/4285; H01R 13/6633; H02G 3/14; H04L 63/18
See application file for complete search history.

(56) References Cited

U.S. PATENT DOCUMENTS

| | | | |
|---|---|---|---|
| 4,145,651 A * | 3/1979 | Ripingill, Jr. ................. | 324/72.5 |
| 6,717,293 B1 | 4/2004 | Irvine et al. | |
| 7,202,658 B2 * | 4/2007 | Ketelaars et al. ......... | 324/207.24 |
| 8,013,613 B2 | 9/2011 | Allen, Jr. | |
| 8,693,228 B2 * | 4/2014 | Matan et al. .................... | 363/97 |
| 2011/0182012 A1 * | 7/2011 | Hilton et al. ............. | 361/679.01 |

* cited by examiner

*Primary Examiner* — Vinh Nguyen

(74) *Attorney, Agent, or Firm* — McKee, Voorhees & Sease, P.L.C.

(57) ABSTRACT

A non-contact voltage detection panel mount assembly is provided. The assembly includes a base to mount to an electrical enclosure, the base including of four voltage portals, a test point and a test voltage generator circuit used to test a pen. The pen is operatively connected to the base and includes an electrical charge storage device, a charge indicator operatively connected to the electrical charge storage device to indicate a presence of a charge within the electrical charge storage device, and a voltage present indicator to indicate presence of a voltage. The pen has a first position for lock-out-tag-out to monitor and test for voltage in any one of the four voltage portals and a second position to determine presence of voltage in the test point.

17 Claims, 5 Drawing Sheets

NON-CONTACT VOLTAGE DETECTOR

CROSS-REFERENCE TO RELATED APPLICATIONS

This application claims priority under 35 U.S.C. §119 to provisional application Ser. No. 61/406,320 filed Oct. 25, 2010, herein incorporated by reference in its entirety.

FIELD OF THE INVENTION

The present invention relates to electrical safety, and more particularly to non-contact voltage detectors.

BACKGROUND OF THE INVENTION

Electrical safety demands we know the correct answer to one question: Is there voltage? Since a wrong answer can have life threatening consequences, like arc flash, for example—many companies spend time and money making sure they can answer that question with unerring certainty. When the NFPA published their Standard for Electrical Safety in the Workplace in the year 2000, that document generated essential changes in the way both electrical and mechanical maintenance is performed in today's industrial and commercial facilities. There is no doubt these changes are positive because injuries and deaths caused by electrical accidents have been significantly reduced. Yet, as with any new regulation, employee productivity has been adversely affected because of the Standard.

What is needed is a method and system which would allow for maintaining the reduction in injuries and deaths attributable to NFPA 70e, but in a manner which allows for returning to the level of productivity experienced prior to NFPA 70e.

Non-contact voltage detectors (NCVD's) are one example of devices which may be used to determine whether or not voltage is present at a location (such as a wire or contact point) being probed. But, because of the possibility of false negatives, meaning that the voltage tester falsely indicates that there is not a voltage when there actually is, NCVD's have not been considered a reliable means in determining electrical isolation. Because of the possibility of a false negative reading, some plants will not allow maintenance workers to carry them. Because a NCVD relies on capacitance, external factors not related to the tested conductor may affect the voltage reading which creates a potential false negative situation when voltage is present. Examples of factors that affect the operation of a NCVD include, without limitation, AC Only, minimum voltage level, phase cancellation, metal barriers (small enclosures), underground cables, hand position, temperature, induced voltage, and frequency. Despite these problems, a voltage portal correctly installed into an electrical panel increases the reliability of the NCVD voltage reading by reducing these variables. In addition, because NVCDs are portable, they can also be checked to an independent voltage source as per NFPA 70E 120.1(5).

Another way to test for voltages is to use a voltage indicator. Voltage indicators installed by qualified electricians are hardwired to the main power disconnect and earth ground. Installation is simple because a phase-neutral high impedance voltage detection circuit on each phase senses and illuminates AC/DC voltage. Two issues with voltage indicators are that (1) it is impractical to verify the voltage indicator to another independent voltage source as attempting to do so adds complexity and reduces reliability and (2) since the voltage indicator's sole purpose is to indicate voltage, any electrical connection between the source voltage and the voltage indicator increases the chance of a false negative voltage reading.

Therefore, what is also needed is an improved device and system for electrical safety.

BRIEF SUMMARY OF THE INVENTION

Therefore, it is a primary object, feature, or advantage of the present invention to improve over the state of the art.

It is a further object, feature, or advantage of the present invention to provide a non-contact voltage detector.

It is a still further object, feature, or advantage of the present invention to provide a non-contact voltage detector which is reliable because it has a hardwired ground reference connection.

It is a still further object, feature, or advantage of the present invention to provide a non-contact voltage detector which is reliable because it has a known reliable capacitive ground reference connection.

Another object, feature, or advantage of the present invention is to provide a non-contact voltage detector which allows for increased productivity without compromising safety.

It is still a further objective to provide a non-contact voltage detector that is a permanent part of the electrical enclosure.

It is a still further object, feature, or advantage of the present invention to provide for improving electrical safety by providing a solution to electrical safety which has benefits of both voltage indicators and voltage portals and meets NFPA 70E 120.1.

It is a still further object, feature, or advantage of the present invention to provide a voltage alert for workers throughout the duration of their work task.

It is still a further objective to provide a non-contact voltage detector system that can be re-tested or verified after the source voltage has been tested to zero energy. One or more of these and/or other objects, features, or advantages of the present invention will become apparent from the specification and claims that follow. No single embodiment need exhibit all of these objects, features, or advantages.

According to one aspect of the present invention, a non-contact voltage detection panel mount assembly is provided. The assembly includes a base to mount to an electrical enclosure, the base including of four voltage portals, a test point, and a test voltage generator circuit used to test a pen. The pen is operatively connected to the base and includes an electrical charge storage device, a charge indicator operatively connected to the electrical charge storage device to indicate a presence of a charge within the electrical charge storage device, and a voltage present indicator to indicate presence of a voltage. The pen has a first position for lock-out-tag-out to monitor and test for voltage in any one of the four voltage portals and a second position to determine presence of voltage in the test point.

According to another aspect of the present invention a method for assisting an electrical worker monitoring voltage is provided. The method includes providing non-contact voltage detector panel mount assembly having a base permanently mounted to an electrical enclosure, the base comprising four voltage portals and a test point, a test voltage generator circuit used to test a pen and a test button operatively connected to test voltage generator circuit, the pen operatively connected to the base and comprising an electrical charge storage device, a charge indicator operatively connected to the electrical charge storage device to indicate a presence of a charge within the electrical charge storage device, and a voltage present indicator to indicate presence of a voltage. The method further includes determining if the non-contact voltage detector panel mount assembly is properly working by pressing the test button to provide a test voltage generated with the test voltage generator circuit and probing the test point of the test voltage generator circuit with the pen to determine if the voltage presence indicator of the pen indicates voltage is present. The method further includes determining if voltage is present by probing any of the four voltage portals using the pen. The method may further include after determining if voltage is present by probing any of the four voltage portals using the pen, again determining if the non-contact voltage detector panel mount assembly is properly working by pressing the test button to provide a test voltage generated with the test voltage generator circuit and probing the test point of the test voltage generator circuit with the pen to determine if the voltage presence indicator of the pen indicates voltage is present.

According to another aspect of the present invention, a non-contact voltage detection device for use by an electrical worker is provided. The device includes a tip for probing a location associated with a voltage source, a non-contact voltage detector circuit, a housing, and means for determining if a circuit is completed between a live conductor, a conductor insulation associated with the live conductor, the tip, the non-contact voltage detector circuit, the housing, the electrical worker, and a ground.

According to another aspect of the present invention, a system for monitoring voltages associated with a circuit is provided. The system includes a non-contact voltage detector, a non-contact voltage detector portal, and at least one lanyard operatively connected between the non-contact voltage detector and ground.

According to another aspect of the present invention, a method for assisting an electrical worker monitoring voltage is provided. The method includes determining if voltage is present at a location by using a non-contact voltage detector comprising a tip, a non-contact voltage detector circuit, and a housing. The method further includes determining if a circuit is completed between a live conductor, a conductor insulation associated with the live conductor, the tip, the non-contact voltage detector circuit, the housing, the electrical worker, and a ground.

According to another aspect of the present invention, a voltage test system configured to (a) initially test that the voltage test system functions properly before an electrical worker isolates electrical energy associated with a voltage source, then (b) test the voltage source for zero electrical energy, then (c) re-test the voltage test system to determine if the voltage test system functions properly.

DETAILED DESCRIPTION OF THE PREFERRED EMBODIMENT

The present invention provides for a handheld non-contact voltage detector which is reliable. A reliable handheld non-contact voltage detector allows for an increase in worker productivity without compromising electrical safety. The present inventor has determined how to make and use a non-contact voltage detector which is reliable.

As previously explained, there are numerous problems associated with present NCVD (non-contact voltage detector) designs. Because a NCVD relies on capacitance, external factors not related to the tested conductor may affect the voltage reading which creates a potential false negative situation when voltage is present. A NCVD must have a completed circuit between the live conductor, conductor insulation, NCVD tip, NCVD circuit, NCVD case, worker and ground. Presently NCVD systems available do not know the state of the live conductor or the insulation. The only remaining unknown is the worker or the NCVD connection to ground. Thus, the NCVD becomes more reliable if these components of the circuit could also become a known.

Figure 1:
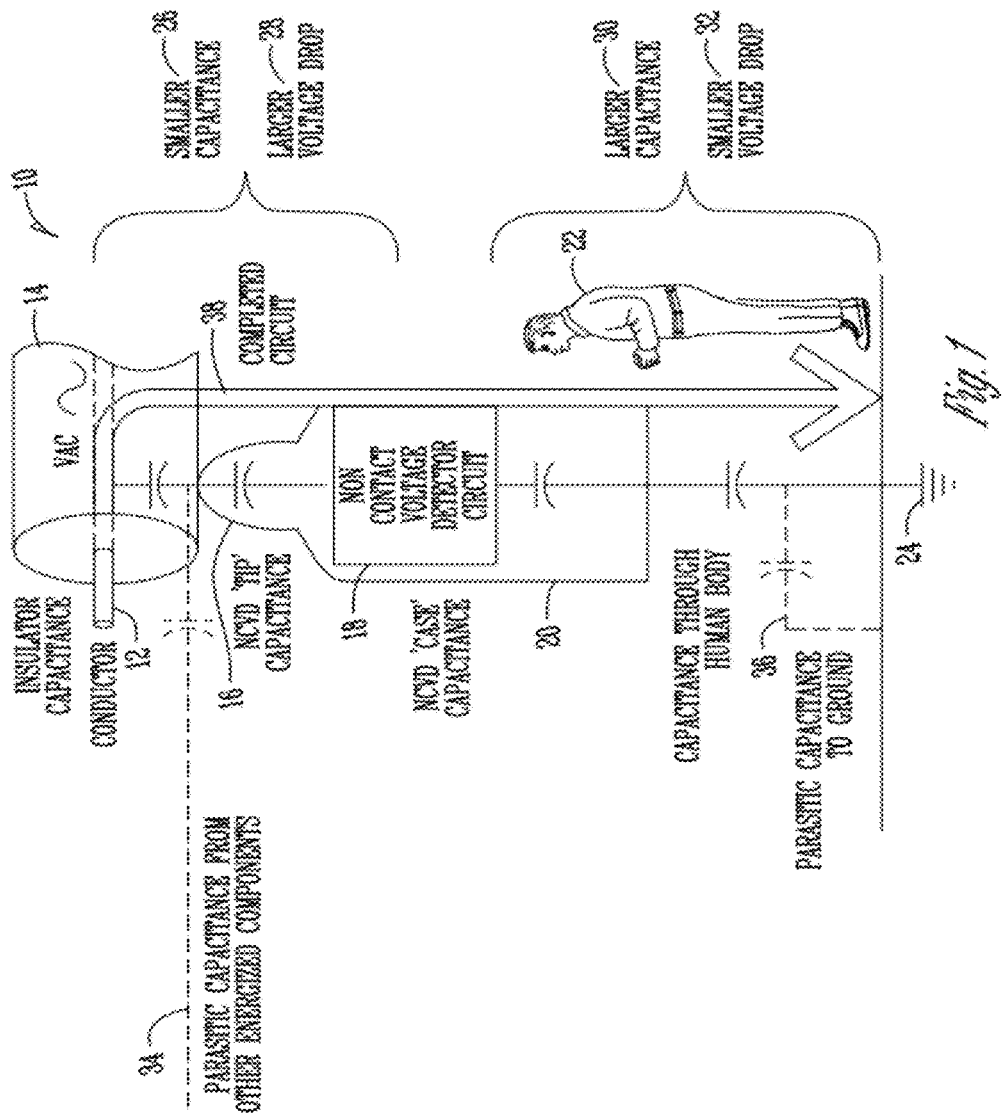
FIG. 1 is an illustration of the NCVD device.

As shown in FIG. 1, a handheld NCVD (non-contact voltage detector) 10 is constructed of tip 16, a non contact voltage detector circuit 18, a notification component, i.e., audible and/or visual which is not shown and a case 20. FIG. 1 illustrates a NCVD 10 checking a conductor 12 for voltage. When the NCVD 10 is positioned next to an energized conductor 12, two capacitive circuits are created. A smaller capacitance 26 exists between the energized conductor 12 and the NCVD 10, while a larger capacitance 30 exists between the NCVD 10 through the electrical worker's body 22 to ground 24. If voltage is applied across a capacitor, then the voltage drop across a small capacitor is bigger than the voltage drop across a larger capacitor. By comparing both of these voltages using a specific non-contact voltage detector circuit 18, the NCVD 10 decides if the conductor 12 is energized. However, because this circuit 18 is somewhat sensitive, other electrical energy within an enclosure will change the effective capacitance and ultimately the operation of NCVD 10.

A false-negative reading is the worst case scenario when stray parasitic capacitance 34 and 36 from other energized components and/or to ground 24 respectively changes the overall capacitance of the circuit 38 in question. However, if we can test that a completed electrical circuit 38 exists, we will know that the conditions are ripe for the NCVD 10 to properly sense voltages.

The NCVD 10 must have a completed circuit 38 between the live conductor 12, the conductor insulation 14, the NCVD tip 16, the non-contact voltage detector circuit 18, the NCVD case (or housing) 20, the electrical worker 22 and ground 24.

Figure 2:
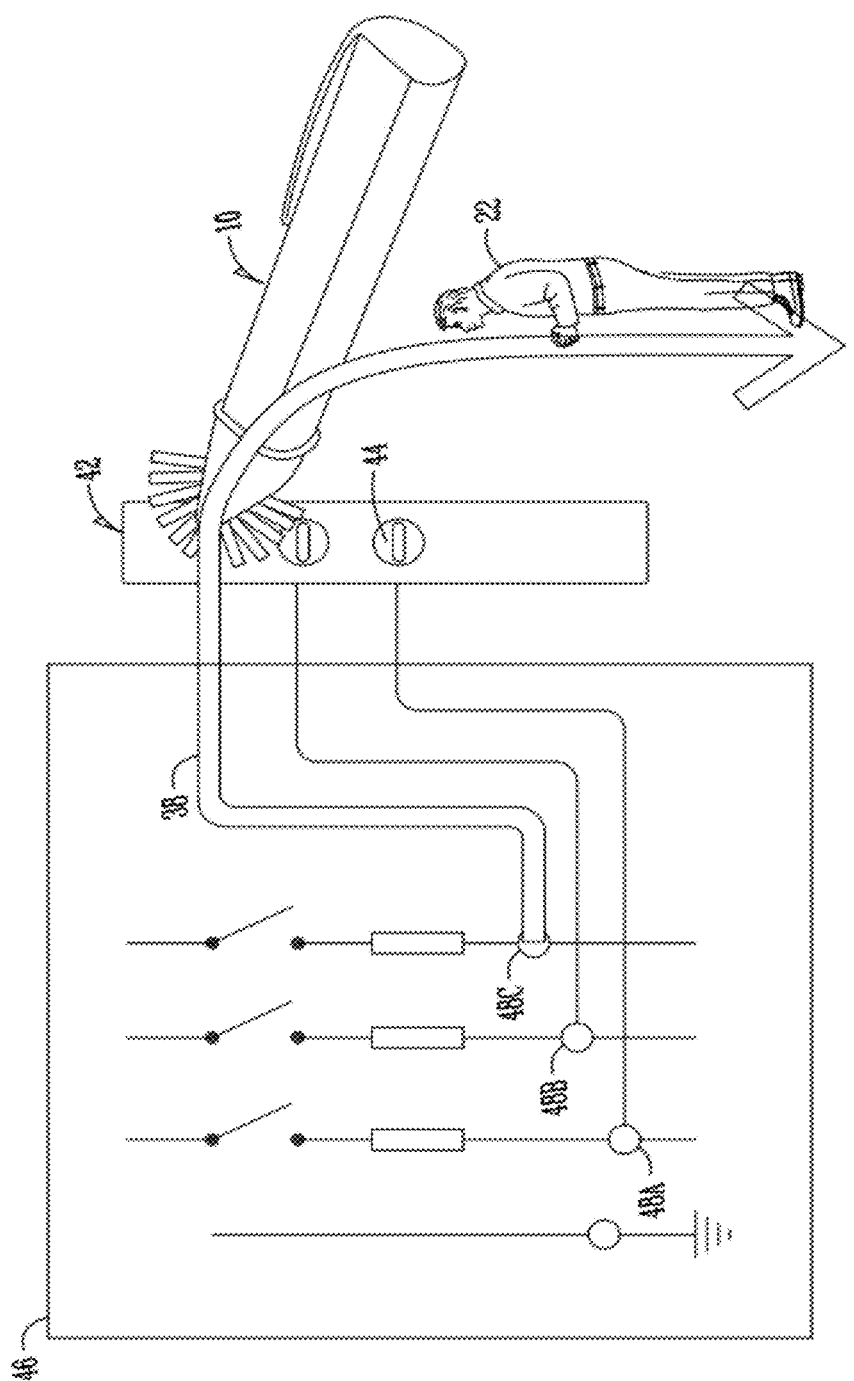
FIG. 2 is an illustration of the NCVD being utilized by a worker.

FIG. 2 illustrates one example of a system that allows for reliable determination of whether or not voltage is present. A non-contact voltage portal interface 42 is installed on a grounded metallic electrical enclosure 46. Leads 48A-C are routed away from anything which may affect parasitic capacitances 34 and 36. When a non-contact voltage portal interface 42 such as ChekVolt® manufactured by Grace Engineered Products, 5001 Tremont Avenue, Davenport, Iowa 52807, is installed into the grounded metallic or non-metallic electrical enclosure 46, a scenario is created whereby the live conductor 12 to conductor insulation 14 capacitance value is now known. Also, the non-contact voltage portal interface 42 lanyards 48A-C can be routed away from anything that could affect parasitic capacitances 34 and 36 and thereby further enhance reliability of the NCVD 10 voltage reading. Furthermore, the NCVD tip 16 to NCVD circuit 18 capacitance value is also now known. Thus, when the NCVD tip 16 is place into non-contact voltage portal 44 the electrical worker 22 is assured via an audible and/or visual alert that the completed circuit 38 is either live or dead.

Figure 3:
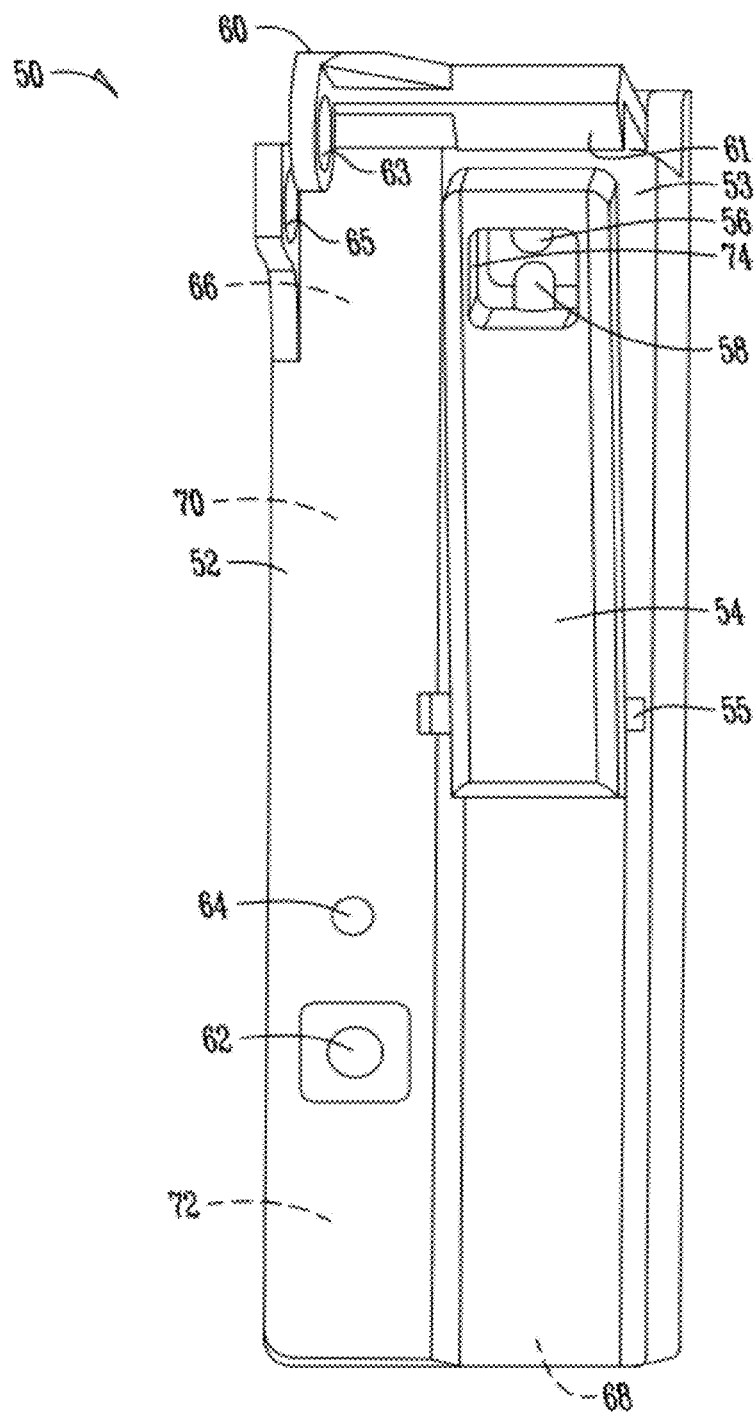
FIG. 3 illustrates an NCVD device with a permanently attached base and a pen on a swing arm.
Figure 4:
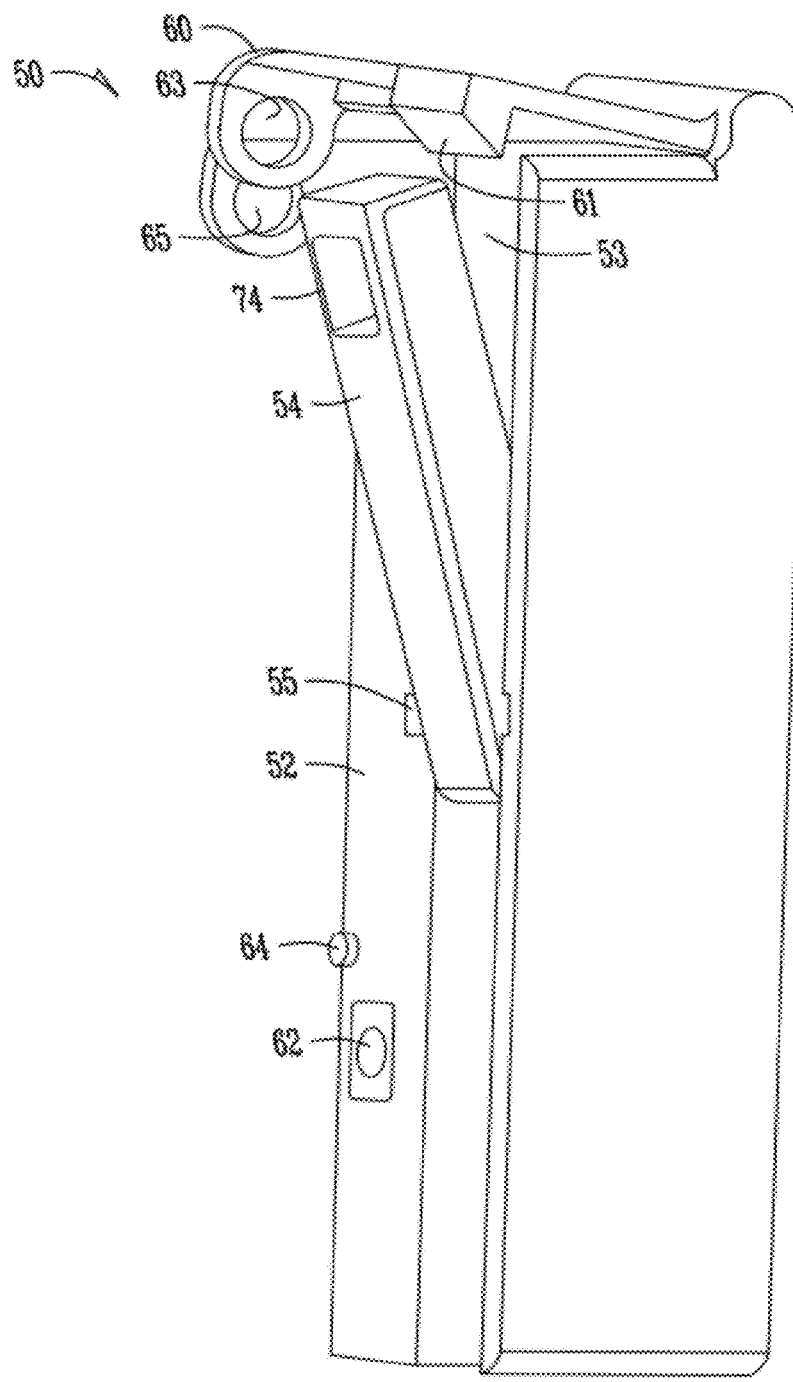
FIG. 4 further illustrates the device of FIG. 3.

FIG. 3 and FIG. 4 illustrate another embodiment of the present invention. In the embodiment of FIG. 3 and FIG. 4 does not rely on use of a person as a part of a circuit. Instead of using a person as a part of the circuit to avoid the effects of undesired capacitance, a ground plane is used and a system is set up to control the placement of the probe. In FIG. 3 a NCVD panel mount assembly 50 is shown. NCVD assembly 50 includes a base 52 and a pen 54. The base 52 may be of different sizes and shapes. In one configuration the base 52 is approximately six inches tall by 1.75 inches wide and 1.4 inches deep. In a typical use, the base 52 is mounted to the flange or side of an electrical enclosure. It may be preferable to mount the base 52 to the flange or side of the electrical enclosure instead of to the door of the electrical enclosure so as to avoid having voltage on the door. In one configuration the pen 54 is approximately three inches long and may be designed to be placed within a slot 53 of the base 52. The pen 54 is operatively connected to the base 52 so as to rotate or swing outwardly on a pivot 55. The pen 54 may also be removed from the base 52. The pen 54 may, for example, be a permanent part of the assembly with an anti-removal screw to prevent removal. Alternatively, the pen 54 may be a portable device that maintenance workers may carry in their tool belts and insert into the base 52 before beginning a lock-out tag-out procedure (LOTO). Indicators such as LEDs 56, 58 may be disposed on the pen 54 when the pen 54 is in an up or down position. A first of the LEDs 56 may be used to show that the pen 54 is on, is charged, or is in the process of charging. The second of the LEDs 58 may be used to show that the pen 54 has detected a voltage.

The pen 54 may be locked in place with a padlock when it is in the up position (LOTO). The lock 60 may be pressed down with a portion 61 extending over the pen 54 to prevent removal of the pen 54 from the slot 53. A padlock (not shown) may then be passed through holes 61, 63 and thus used to prevent the lock 60 from being pressed up thereby preventing the pen 54 from being removed. There may be four voltage portal wires (L1, L2, L3, 120 VAC separate control) that may be connected to voltage sources from which the pen 54 will be able to detect voltage on any one of these four voltage portals. The present invention contemplates that any number of different 3-phase voltage portals may be used. One example in disclosed in U.S. Pat. No. 6,717,293, herein incorporated by reference in its entirety. When the pen 54 is swung to a down position the pen 54 is in a standby, test, or charge mode. A button 62 is shown which may be used to test the pen 54. The test circuit may be powered by a batter that may be charged from 24 volts AC. This voltage is should be from a different source than the source that is being tested. When the test button 62 is pressed a circuit will create a test voltage (approximately 50 VAC) that will test the pen 54. This test circuit includes an indicator such as an LED 64 to show that the test circuit is powered and another indicator to show that the test circuit is active. When the test circuit is active the LED 56 may turn on showing that there is a voltage at the voltage source. When the pen 54 is in the down position the rechargeable batteries will be charged and the LED 58 on the pen 54 may indicate that the pen 54 is charging.

By designing the pen 54 to swing up and fit into the base 52 at the correct location, the probe 74 of the pen 54 is at a required distance from the voltage source 66. The voltage source 66 may be fixed inside the base 52 at a required distance from the wall of the probe 74 in the pen 54 to match. To make the device 50 more reliable a ground plane 68 may be placed in the base 52 behind the pen 54. By having the ground plane 68 a fixed distance away the capacitive coupling distance to ground is improved.

Also note that it is desirable to for the test point and the voltage portals to have the same electrical and mechanical properties so as to control effects of capacitance. The mechanical properties can include the same distance for an air gap using the same materials with the same thickness or other mechanical properties which could affect capacitance. Similarly, the ground connection between the test point and the pen has the same electrical and mechanical properties in both the first position and the second position.

The up position and down position of the pen 54 may be sensed in various ways. For example, one magnetic relay 70 may be placed in the base 52 towards the top of the base and a second magnetic relay 72 may be placed in the base 52 towards the bottom of the base. Of course, the position of the pen 54 may be sensed in any number of different ways using any number of different technologies.

Figure 5:
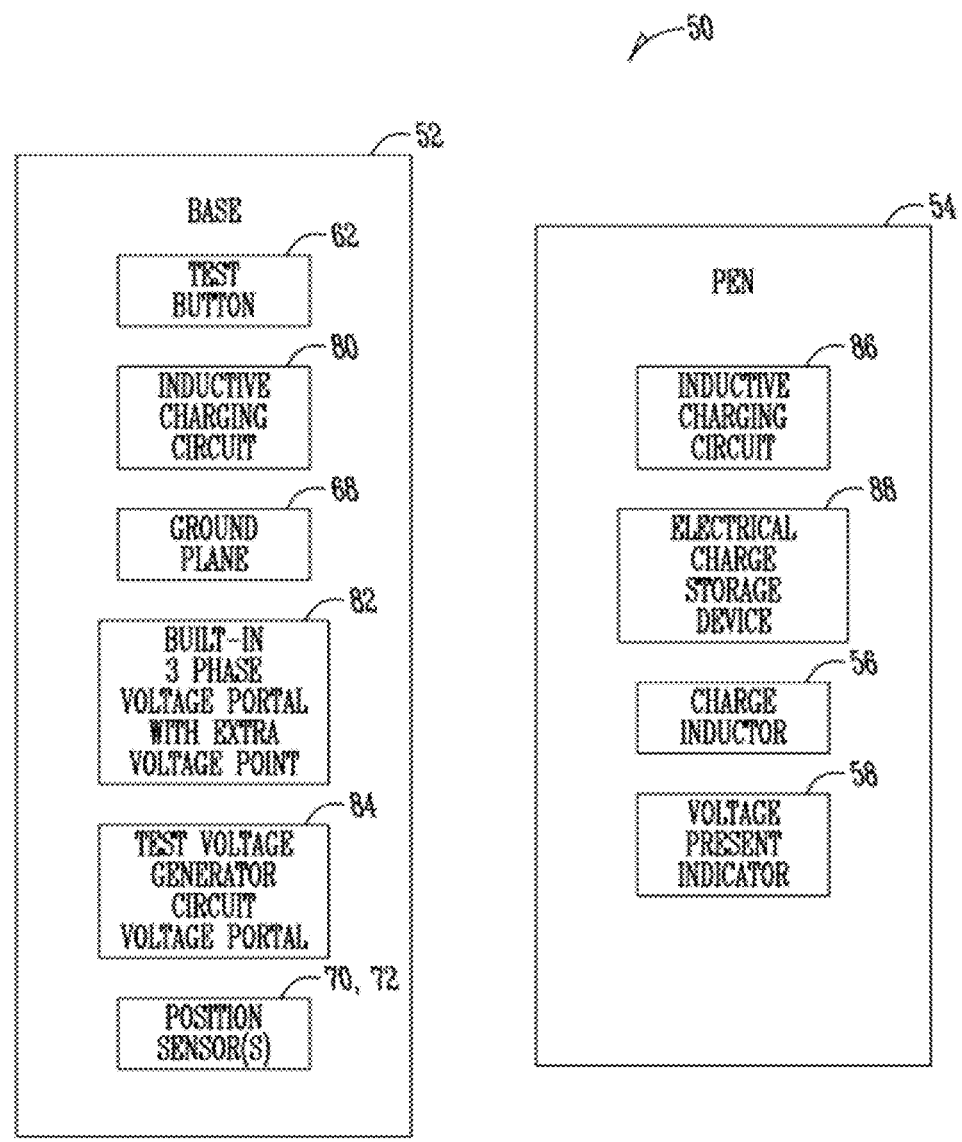
FIG. 5 is a block diagram illustrating the device of FIGS. 3 and 4.

FIG. 5 illustrates a block diagram of the embodiments shown in FIG. 3 and FIG. 4. In the device 50, a base 52 and a pen 54 are shown. The base includes a test button 62, an inductive (output) charging circuit assembly for the pen 54, a ground plane 68, and a built-in 3-phase voltage portal with an extra voltage point (120 VAC separate control) 82, and a test voltage generator circuit and voltage portal 84. The base 52 may also include position sensors 70, 72 for sensing the position of the pen 54. The pen 54 includes an inductive (input) charging circuit 86, an electrical charge storage device (battery or super capacitor) 88, a charge indicator 56, and a voltage present indicator 58. Note that the inductor charging circuit 80 of the base 52 and the inductive charging circuit of the pen 86 are used together to form a complete inductive charging circuit. The pen 54 may be placed in two different positions relative to the base 52. In the first position or the Lock-out-tag-out (LOTO) position the pen 54 is in an up and lockable position (where a pen locking mechanism is present) and in the second position or standby/charge/test position, the pen 54 is down.

Therefore, a NCVD (non-contact voltage detector) has been disclosed. Although various examples are given, the present invention is not to be limited to the specific type of NCVD, but rather the present invention contemplates numerous variations, options, and alternatives. It should also be understood that NCVD shown in FIG. 1 and FIG. 2 and the NCVD shown in FIG. 3 through FIG. 5 both show a voltage test system that is configured to initially test that the voltage test system functions properly before an electrical worker isolates electrical energy associated with a voltage source, then test the voltage source for zero electrical energy, then re-test the voltage test system to determine if the voltage test system functions properly.

What is claimed:
1. A non-contact voltage detection panel mount assembly, comprising:
  a base to mount to an electrical enclosure, the base comprising of three voltage portals for line voltage, a test point and a test voltage generator circuit used to test a pen wherein the test voltage generator circuit is configured to generate a voltage signal at the test point;
  the pen operatively connected to the base and comprising an electrical charge storage device, a charge indicator operatively connected to the electrical charge storage device to indicate a presence of a charge within the electrical charge storage device, and a voltage present indicator to indicate presence of a voltage when the pen detects the voltage at one of the voltage portals for the line voltage or the test point;
  wherein the pen having a first position for lock-out-tag-out to monitor and test for voltage at any one of the three voltage portals and a second position to determine presence of voltage at the test point;

wherein the non-contact voltage detection panel mount assembly provides for forming a capacitive circuit with either the test point or one of the voltage points to allow for non-contact voltage detection.

2. The assembly of claim 1 wherein the test point and the voltage portals have electrical and mechanical properties which are the same.

3. The assembly of claim 2 wherein a ground connection between the test point and the pen has the same electrical and mechanical properties in both the first position and the second position.

4. The assembly of claim 3 wherein the ground connection is a hardwired ground reference connection.

5. The assembly of claim 3 wherein the ground connection is a capacitive ground reference connection.

6. The assembly of claim 1 wherein the pen is pivotally connected to the base to swing up to the first position and swing down to the second position.

7. The assembly of claim 1 further comprising at least one position sensor in the base wherein the at least one position sensor is configured for sensing whether the pen is in the first position for lock-out-tag-out to monitor and test for voltage at any one of the three voltage portals or the second position to determine presence of voltage at the test point.

8. The assembly of claim 7 further comprising a test button on the base the test button electrically connected to the test voltage generator circuit to generate the voltage signal at the test point.

9. The assembly of claim 1 further comprising a lock assembly to allow for locking the pen to the base.

10. The assembly of claim 1 wherein a ground connection between the test point and the pen is a hardwired ground reference connection.

11. The assembly of claim 1 wherein a ground connection between the test point and the pen is a capacitive ground reference connection.

12. The assembly of claim 1 further comprising an inductive charging output circuit in the base and an inductive charging input circuit in the pen.

13. A method for assisting an electrical worker monitoring line voltage, the method comprising:

providing a non-contact voltage detector panel mount assembly comprising a base permanently mounted to an electrical enclosure, the base comprising a voltage generator test point and three voltage portals, a test voltage generator circuit used to test a pen and a test button operatively connected to test voltage generator circuit wherein the test voltage generator circuit is configured to generate a voltage signal at the voltage generator test point, the pen operatively connected to the base and comprising an electrical charge storage device, a charge indicator operatively connected to the electrical charge storage device to indicate a presence of a charge within the electrical charge storage device, and a voltage present indicator to indicate presence of a voltage when the pen detects the voltage at one of the three voltage portals or the test point;

determining if the non-contact voltage detector panel mount assembly is properly working by pressing the test button to provide a test voltage generated with the test voltage generator circuit and probing the test point of the test voltage generator circuit with the pen to determine if the voltage presence indicator of the pen indicates voltage is present; and determining if voltage is present by probing any of the three voltage portals using the pen;

wherein the non-contact voltage detection panel mount assembly provides for forming a capacitive circuit with either the test point or one of the voltage points to allow for non-contact voltage detection.

14. The method of claim 13 further comprising after determining if voltage is present by probing any of the three voltage portals using the pen, again determining if the non-contact voltage detector panel mount assembly is properly working by pressing the test button to provide a test voltage generated with the test voltage generator circuit and probing the test point of the test voltage generator circuit with the pen to determine if the voltage presence indicator of the pen indicates voltage is present.

15. The method of claim 13 wherein a ground connection between the test point and the pen has the same electrical and mechanical in both the first position and the second position.

16. method of claim 15 wherein the ground connection is a hardwired ground reference connection.

17. method of claim 15 wherein the ground connection is a capacitive ground reference connection.

* * * * *